Sept. 13, 1960 S. R. BROWN 2,952,773

STABLE WAVEFORM GENERATOR

Filed March 17, 1958 2 Sheets-Sheet 1

INVENTOR:
STANLEY R. BROWN,
BY Walter C. Bendorf
HIS ATTORNEY.

Sept. 13, 1960 S. R. BROWN 2,952,773

STABLE WAVEFORM GENERATOR

Filed March 17, 1958 2 Sheets-Sheet 2

INVENTOR:
STANLEY R. BROWN,

BY Walter C. Benkopf

HIS ATTORNEY.

2,952,773
STABLE WAVEFORM GENERATOR

Stanley R. Brown, North Syracuse, N.Y., assignor to General Electric Company, a corporation of New York Filed Mar. 17, 1958, Ser. No. 721,891
4 Claims. (Cl. 250—27)

The present invention relates to stable waveform generators and more particularly to electronic circuits which generate a waveform accurately varying in amplitude with elapsed time according to a desired pattern.

In numerous electronic applications it is necessary to generate waveforms in a voltage-time coordinate system. Such waveforms, commonly required in analogue computers, radar, communication circuits and other devices, must frequently be of extreme accuracy so that the voltage output actually generated at any given time closely conforms to the ideally desired voltage output. Waveforms having a desired voltage-time coordinate characteristic are generally created by applying an input waveform to a waveform generator which supplies an output having the desired characteristics. For great waveform accuracy it is generally desirable to utilize operational amplifier type waveform generators in which waveform-modifying elements operate in conjunction with high gain amplifiers. However, even with such devices, generation of waveforms of high accuracy has presented great problems, as may be demonstrated by a discussion of one particular type of waveform, i.e. one varying linearly with elapsed time and in which the waveform voltage has a predetermined amplitude at a designated zero time and then varies linearly toward a second predetermined voltage at a second predetermined time.

A linear voltage waveform is generally obtained by applying an input waveform, i.e. a step voltage, to a waveform generator which has the characteristics of an electronic integrating circuit. One early form of integrating circuit depends upon the exponential voltage rise occurring across a capacitor in series with a voltage source and resistor, for which an approximation can be made that the voltage waveform across the capacitor is linear over a short interval where the time constant of the R-C charging, or discharging, circuit is sufficiently large compared with the time duration of the waveform. Waveforms of greater linearity and thus of greater accuracy may be obtained by special types of operational amplifiers. One operational amplifier employing a capacitive reactance in parallel with an amplifier, utilizes the Miller effect where the equivalent of a very large high quality capacitor is achieved by applying a large percentage of negative capacitive feedback to a high gain amplifier. The input to the amplifier of such a device appears essentially as a large capacitance so that small voltage changes appearing across the equivalent capacitance are nearly linear, and the resultant voltage change at the output of the amplifier is also nearly linear due to the large amount of feedback utilized.

The ultimate aim of such a waveform generator is to originate a waveform at a given time and a given voltage which rises in a linear fashion to reach a second given voltage at a second given time. In order to meet this objective the following four parameters must be met: (1) the wave must start at the right time, (2) the wave must start at the right voltage, (3) the wave must remain linear, and (4) the wave must rise with right slope. In circuits heretofore used for these applications, parameters (1) and (4) imposed no real stringent limitations. However, parameter (3), i.e. waveform linearity, was limited by the gain of the feedback amplifier. The feedback amplifier gain in turn was limited by parameter (2) i.e., the starting voltage of the waveform, because an increase of amplifier gain increases the output amplitude of the noise voltage picked up at the amplifier input. Thus, prior high linearity waveform generators were ultimately limited in overall performance either by insufficient linearity or excessive uncertainty of the starting voltage.

It is an object of this invention to provide a new and improved method of generating an electrical waveform in an amplitude vs. time coordinate system accurately conforming to a desired waveform pattern.

It is a second object of this invention to provide a new and improved waveform generating system capable of producing waveforms of great accuracy and initiated at a predetermined voltage amplitude.

It is a third object of this invention to provide a waveform generator capable of providing an extremely accurate waveform output wherein the overall uncertainty of the time-voltage coordinate point of waveform initiation is reduced.

It is a fourth object of this invention to provide a waveform generator circuit capable of utilizing a high gain amplifier without the deleterious effects of variations in the initiating voltage.

It is a fifth object of this invention to provide a waveform generating circuit which is capable of producing a waveform of great accuracy originating at a given time with a given voltage and varying linearly to reach a second given time.

These and further objects of the invention are achieved by a reduction of random amplitude variation of the waveform starting voltage. This reduction is achieved at the time of waveform initiation by applying a stable voltage, having the starting amplitude of the waveform, to the waveform generator output while the waveform generator amplifier circuit is disabled. The amplifier circuit is disabled so as to avoid initial random amplitude variations by amplified generator input noise signals. Upon application of the waveform generator input, the stabilizing voltage is removed and the amplifier circuit is established. The waveform starting voltage is thus greatly stabilized at the expense of a slight time delay in initiating the output waveform, i.e. the delay between the time the generator input is applied and the time the amplifier circuit is established and the output waveform is initiated. The increase in starting voltage certainty at the expense of a slight starting time uncertainty results in a marked improvement of overall waveform certainty, i.e. a reduction in waveform voltage deviation error at any given time.

Briefly stated in accordance with one aspect of the invention an operational amplifier type of linear waveform generator is provided having at least two amplifier stages. During the actual time duration of linear waveform generation, the first amplifier stage output is in series circuit connection with the input of the second amplifier stage, so that the circuit operates during this time interval in conventional fashion. Between the time duration of actual linear waveform generation, the input of the second amplifier stage is disconnected from the output of the first stage and is instead connected in a degenerative feedback circuit with a portion of its output load. The feedback path of the waveform generator is thus open prior to the time of actual linear waveform generation and the output of the circuit is effectively preset to the initial voltage level of the waveform. Since the degenerative feedback loop is open prior to the actual initiation of the linear waveform, it is possible to materially reduce the uncertainty of the waveform voltage at the initiating time, and the noise voltage appearing at the input of the amplifier does not act as a limiting factor to the total amplifier gain. The switching of the second amplifier input, which occurs at the time of initiation of the linear waveform and again at the time of termination of the waveform, may be actuated by a voltage change which is a function of the step voltage applied to the input of the integrating circuit. The input to the second amplifier stage is therefore not switched to the output of the first amplifier stage until a short time after the application of the input step voltage. Although increasing the certainty of the initiating voltage required some uncertainty in the initiating time, i.e., the time delay between the application of the step voltage and the time of switching, the net effect is to reduce the overall uncertainty of the time-voltage starting point of the linear waveform output and to improve waveform linearity by virtue of allowing an overall higher gain feedback loop.

While the specification concludes with claims particularly pointing out and distinctly claiming the subject matter which is regarded as the invention, it is believed that the invention will be better understood as the following description is taken in connection with the accompanying drawings in which:

Figure 1:
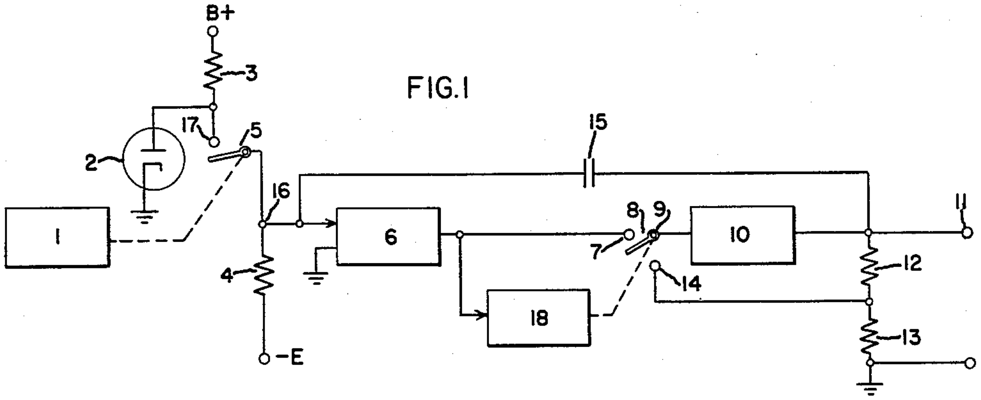
Fig. 1 is a diagrammatic representation in block form of a waveform generating circuit embodying the invention.

Referring now to Fig. 1, an input waveform generating circuit, comprising switch-operating device 1, diode 2, resistors 3 and 4, and switch 5, is adapted to apply a negative step-function waveform to the waveform generator integration circuit when switch 5 is opened. This step function waveform is applied to an amplifier, 6, whose output is connected to one stationary terminal, 7, of switch 8. Moveable element 9 of switch 8 is connected to the input of a second amplifier stage 10 which supplies the linear output waveform at an output terminal 11. It should be noted that switching actions are in actual practice accomplished by high speed electronic devices and that the references to mechanical switch components are made only to simplify the description. A suitable load circuit shown as comprising resistors 12 and 13, is connected from output terminal 11 to ground. The intermediate connection point between these resistors is connected to stationary terminal 14 of switch 8. A feedback capacitor 15 is connected between output terminal 11 and input terminal 16 of the first amplifier.

Figure 2:
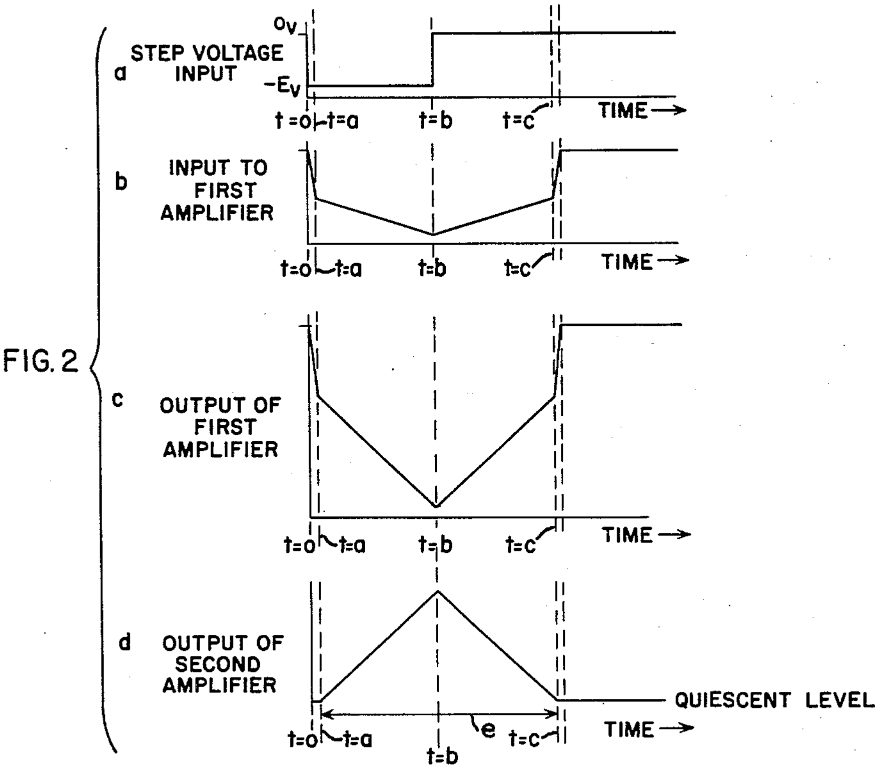
Fig. 2 is a series of curves drawn on a common time base, illustrating the possible time vs. potential relation of certain points in the circuit of Fig. 1 and the time relationship at which the switching action occurs.

Switch 5 of the step function waveform generating circuit is normally closed but is opened by switch-actuating device 1 for the predetermined duration of the step function waveform. It may be seen that with switch 5 in the closed position, i.e., with the switch arm contacting terminal 17, the input to the first amplifier is at ground potential, because the voltage appearing at the junction of resistors 3 and 4 is clamped to ground potential by diode 2. When the switch is opened by switch-actuating device 1, the negative potential, —E, at resistor 4 is applied directly to the input 16 of the amplifier 6 and remains applied until the switch is again closed. Fig. 2*a* illustrates the waveform of the voltages output at terminal 16, neglecting the waveform modifying action of the amplifier input circuit. Referring now to Fig. 2*b*, it may be seen that upon opening of switch 5, the input voltage of the first amplifier commences to decrease toward —E at a rapid rate determined by the time constant associated with resistors 4, 12 and 13 and capacitor 15. This in turn results in an amplified negative-going voltage at the output of the first amplifier stage, i.e., at terminal 7 of switch 8, as shown in Fig. 2*c*. When this voltage drops to a predetermined level, at a time designated in Fig. 2 as $t=a$, a control circuit 18 is energized to actuate switch 8 so that lever arm 9 contacts terminal 7. The output of the first amplifier 6 is then applied to second amplifier 10 and the parallel feedback network is established. The circuit then operates with an increased apparent capacity at the input of the first amplifier, i.e., terminal 16, which is a function of the series gain of the two amplifiers. After switching, the voltage at terminal 16, therefore, continues to decrease linearly at a sharply decelerated rate, as does the voltage at the input of amplifier 10. This is represented graphically in Figs. 2*b* and 2*c*. Upon actuation of switch 8 at time $t=a$, the integrator output voltage, at terminal 11, proceeds to increase linearly in a positive direction from the quiescent voltage level, as illustrated in Fig. 2*d*.

Switch-actuating device 1 is designed to close switch 5 after the pre-determined duration of the step function waveform at a time designated in Fig. 2 as $t=b$. Although the voltage level at terminal 16 would then return to ground level, as indicated in Fig. 2*a*, neglecting the presence of the amplifier, the voltage at 16 actually proceeds to return in a positive direction at approximately the prior charging rate, except that the total time constant is now affected by resistor 3, as shown in Fig. 2*b*. There is a corresponding voltage change applied to amplifier 10, as shown in Fig. 2*c*. When the voltage output of amplifier 6 returns to a predetermined level at a time designated in Fig. 2 as $t=c$, the control network 18 actuates switch 8 so that arm 9 again contacts terminal 14 and thus opens the integrator feedback network. A feedback circuit is then established across amplifier 10 and a portion of the output load circuit, resistor 12, so as to stabilize the waveform generator output at terminal 11 at the proper waveform starting voltage prior to initiation of the next step waveform and thus prior to initiation of the next generated linear waveform.

Figures 3, 4:
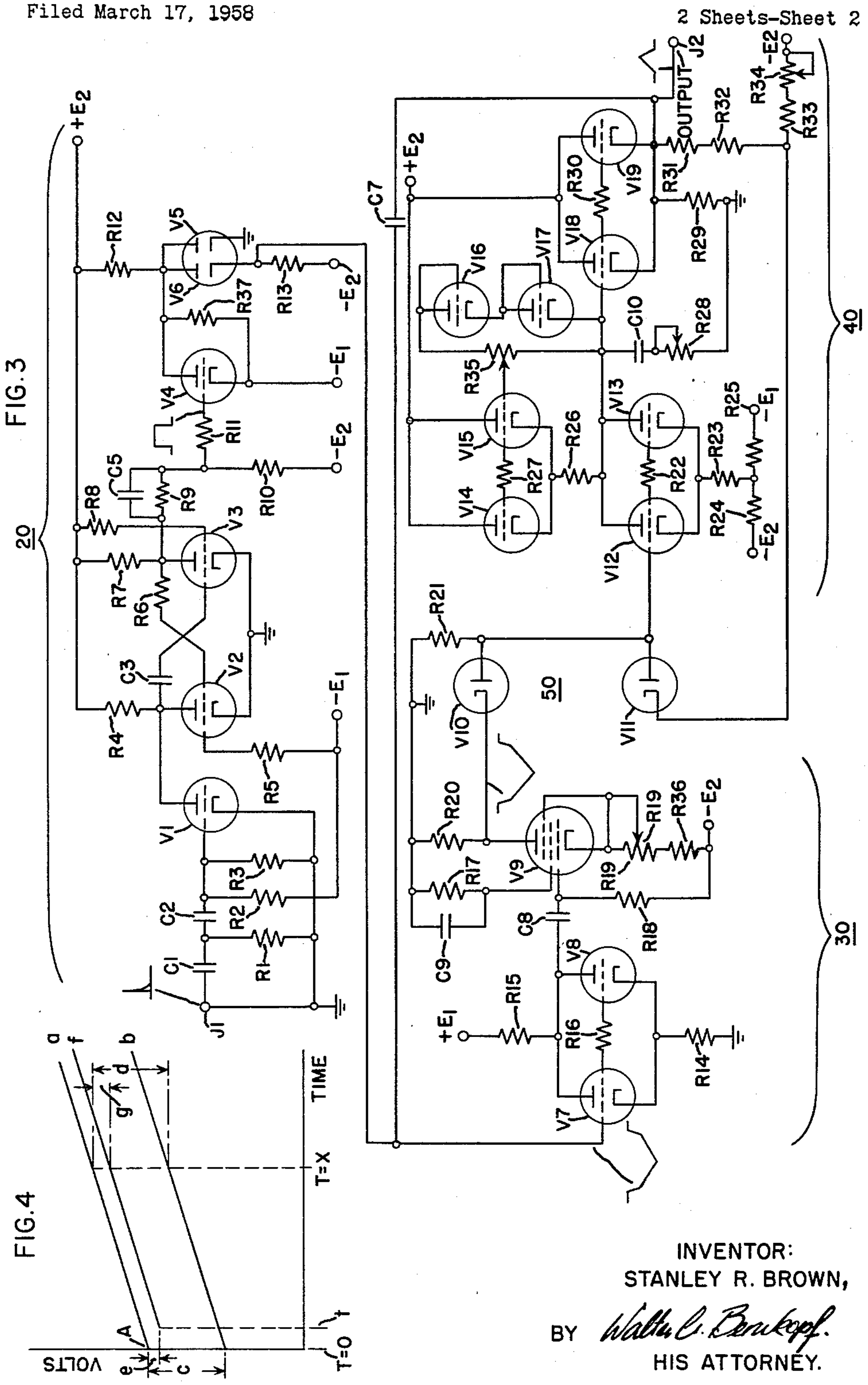
Fig. 3 is a schematic diagram of a preferred embodiment of the waveform generating circuit of Fig. 1.
Fig. 4 is a graph of linear waveforms in a voltage-time coordinate system, illustrating the result of variations in waveform-initiating time and initial waveform amplitude.

Fig. 3 illustrates a circuit diagram of a preferred embodiment of the invention, which has provided exceptionally linear waveform outputs having a linearity about ten times better than that of the known prior art generators. To facilitate description, the linear waveform generator may be analyzed as comprising a step wave generator 20 coupled to a first amplifier 30, a second amplifier 40 supplying the waveform generator output, and a switching circuit 50 for selectively switching the second amplifier input to the first amplifier output or to a degenerative feedback circuit including the second amplifier output load circuit. Since the component assemblies per se, i.e., the step wave generator and amplifiers, are old in the art, the description is limited to clearly disclose the operation of such component assemblies in the overall invention.

The step wave generator 20 comprises buffer amplifier stage V1, a one-cycle multivibrator incorporating tubes V2 and V3, the output buffer-amplifier stage V4, and the clamping network incorporating diodes V5 and V6. A positive trigger voltage pulse applied from an external source (not shown) to the input, J1, of the step wave generator 20 produces a step wave having a time duration determined by the constants of the single shot multivibrator. This step wave is applied to the input of the first amplifier, 30. Amplifier 30 comprises a first stage, i.e., parallel connected tubes V7 and V8, whose output is coupled to a second stage V9. The output of the amplifier 30, i.e., at the output of V9, is coupled through diode V10 to the input of the second amplifier, 40, which includes a first stage, i.e., parallelly connected tubes V12 and V13, coupled to a cathode follower stage, i.e., parallelly connected tubes V18 and V19, whose cathode output supplies the desired waveform generator output. The switching circuit, 50, which switches the input connection of amplifier 40 comprises diodes V10 and V11, with diode V10 switching the connection between the output of the first amplifier and the input of the second amplifier and with diode V11 switching the degenerative feedback circuit from the load output of the second amplifier to the input of that amplifier. Parallel tubes V14 and V15 in conjunction with cascaded tubes V16 and V17 comprise a linearizing and temperature compensating circuit for parallel tubes V12 and V13 of the second amplifier.

The operation of the waveform generator is as follows: a positive trigger pulse is applied to the input terminal J1 of the input circuit and is applied to the grid of the first stage, V1, which is normally biased to cut off by the grid resistor network comprising R2 and R3. The conventional one-cycle multivibrator, comprising V2 and V3, is biased so that tube V3 is normally conducting and thus supplies a low plate voltage output to the grid of the subsequent amplifier V4. Quiescent conduction of V3 is established by the positive potential on the grid of V3 in respect to that of V2. Upon application of the negative trigger pulse, from the plate of V1 to the grid of V3, the latter stage cuts off with a resulting rise in plate voltage and remains cut off for a period determined largely by the RC time constant of R4, R8 and C3. After a predetermined time period V3 resumes conducting and its plate voltage again drops to the quiescent level. A positive step voltage having a predetermined time interval therefore appears at the grid of amplifier stage V4. The plate output of V4 is applied to the first amplifier, 30, through a network which includes resistors R12 and R13, and diodes V5 and V6. Resistor R12 is connected from a positive potential, $+E_2$, to the junction of the amplifier V4 plate and the plates of diodes V5 and V6. The cathode of V5 is grounded whereas the cathode of V6 is parallelly connected to the input of amplifier 30 and to resistor R13, which is connected to a negative voltage source, $-E_2$. The parameters of the series network extending from $-E_2$ to $+E_2$ and incorporating R12, R13 and V6 are such that, neglecting the effects of V4 and V5, a positive potential exists during quiescence at the junction connected to the input of amplifier 30. However, diode V5 is connected so that the voltage at the plate of V6 can never exceed ground potential and thus clamps the input of the first amplifier to ground potential during quiescence. When the positive step voltage is applied to the grid of V4, that tube goes into conduction and provides a low impedance path between the negative voltage at the cathode of V4, $-E_1$, and the junction of the plate of V4 and resistor R12. This results in a negative voltage drop at the plate of V6. The time constant of component C7, R13, R29, and R31 through 34 is such that the cathode of diode V6 cannot follow this drop, so that the tube is cut off, effectively applying negative voltage $-E_2$, through resistor R13 to the grid of tube V7 of amplifier 30.

The signal appearing at the grid of tube V7 is not a negative step wave, but assumes the form shown in Fig. 2*b*. Because of the action of feedback capacitor C7 connected from the input of the first amplifier to the output of the second amplifier and the associated load network of R31, R32, R33, R34 and R29 in the output circuit of amplifier 40, the input voltage instead of initially dropping sharply tends to discharge exponentially at a rate determined by these components. This negative going signal is coupled to the first stage of amplifier 30, i.e., tubes V7 and V8, which in turn supplies a positive going signal to the second stage, i.e., the grid of V9. It should be noted that the first stage, as well as some other amplifier stages subsequently described, employs two tubes in parallel so as to increase the amplifier stage transconductance. Amplifier stage V9 has its plate circuit connected to ground and its cathode circuit connected to a negative potential, so that its plate output signal, coupled to diode V10, of switching circuit 50, will have the proper voltage reference level. Potentiometer R19, in series with resistor R36 in the V9 cathode circuit may be adjusted to set the delay time referred to as $t=a$ in Fig. 2. The plate output signal of amplifier V9, applied to the input amplifier 40, is a negative going voltage, i.e., an amplified version of the signal seen at the input of the first stage of amplifier 30.

Amplifier 40 has a first stage comprising tubes V12 and V13 operating in parallel. The grid input of V12 is connected to switching circuit 50, i.e., to the plates of diodes V10 and V11, and to a parallel load resistor, R21, which is connected to ground. Diodes V10 and V11 operate as a control or switching circuit which supplies the cathode signal from one of the two diodes to the input of amplifier 40. The diode cathode signal having the greatest negative polarity is applied to the grid input of V12 to the exclusion of the cathode signal applied to the other diode. Assuming the cathode voltage of V10 to be more negative than that of V11, V10 will conduct and will lower the plate voltage of V11 below the V11 cathode voltage and thus cut off the latter tube. The diode circuit effectively acts as a two pole switch connecting the input of amplifier 40 either to the output of amplifier 30 or to a degenerative feedback circuit extending from the output load circuit of amplifier 40, i.e., the junction of R32 and R33. The quiescent voltage level applied to the cathode of V11 is established by the setting of potentiometer R34 in the load circuit of amplifier 40, so as to be more negative than the quiescent voltage level output of amplifier 30, i.e., the plate of V9. Therefore, initially the input of amplifier 40 is connected in degenerative feedback relation with its load circuit. When, the output signal of amplifier 30, at the plate of V9, has dropped below the cathode potential of V11, at the time designated as $t=a$ in Fig. 2, diode V10 conducts and applies the output signal of amplifier 30 to the input of amplifier 40 at the grid of V12. At this time V11 is simultaneously cut off, thus opening the degenerative feedback circuit of amplifier 40. It should be noted that the adjustment of potentiometer R19, in the cathode circuit of V9, determines the time lag between initiating pulse, applied to terminal J1, and the time amplifier 30 is connected to amplifier 40.

The output signal of amplifier 30 remains at a negative potential in respect to the cathode of diode V11, and the output of amplifier 30 remains connected to the input of amplifier 40 until the time designated as $t=c$ in Fig. 2. At time $t=c$ the input of amplifier 40 is again connected in feedback relation with its load circuit. The plate output of the amplifier stage comprising parallel tubes V12 and V13, is connected to the grid of V18, which operates as a cathode follower in conjunction with V19. Capacitor 10 and resistor 28 in the V18 grid input circuit comprise a compensating control circuit establishing the high frequency cut off characteristics of the combined amplifier so as to increase high frequency stability. The output of the cathode follower V18 and V19, substantially identical to the output of the preceding stage, is connected to output terminal J2 and supplies the waveform generator output signal. In addition, this cathode output is feedback coupled through capacitor 7 to the input of the first amplifier.

Tube sections V14 through V17, in amplifier 40, are of identical structure to tube sections V12 and V13 and constitute a linearization and a compensation circuit for plate current variations in tube sections V12 and V13 due to variations in V12 and V13 filament voltage or temperature. Tubes V14 and V15 operate so that the nonlinear characteristics of V12 and V13 are compensated by virtue of negative feedback of the voltage appearing across R26 to the grids of V14 and V15. Therefore, a change in V14 and V15 tube current and tube impedance compensates for the nonlinearity due to current changes in stages V12 and V13. Amplifiers V16 and V17 are cascaded in series with potentiometer R35 whose variable arm is connected to the grid of V15. It should be noted that the filaments of V12 through V17 are supplied from a common source. Therefore, current flow through V16 and V17, which is a function of cathode temperature and thus filament voltage and ambient temperature, produces a potential drop across R35 which in turn tends to regulate V14 and V15 so that the overall action of tube sections V14 through V17 eliminates the undesirable effects due to filament voltage or current variation of tubes V12 and V13.

The waveform generator output signal, at J2, has a quiescent voltage level determined by the parameters of output load circuit, comprising R29 and R31 through R34, and the degenerative feedback circuit from the junction of R32 and R33. Upon initiation of the step voltage signal, the voltage in the output of amplifier 30, i.e., at the plate of V9, proceeds negatively at a rapid rate determined primarily by the parameters of the RC network comprising capacitor C7, and resistors R31 through R34, R29, and R13 until shortly thereafter, the output of amplifier 30 is coupled, through diode V10, to the input of amplifier 40. At this time the output of the waveform generator, at J2, proceeds to increase positively from the quiescent level at a rate determined by R13 and the effective input capacity at V7, i.e., approximately C7 times the gain of the loop comprising amplifiers 30 and 40, until the termination time of the step wave applied to amplifier 30. It should be noted that the time interval between initiation of the step wave and the time of initiation of the output signal at J2 is extremely short and is insignificant in respect to the increased stability of the output voltage at the time the output waveform is initiated. Subsequent to the termination of the step wave at the time designated as $t=b$ in Fig. 2, the signal at the input of amplifier 30 decreases in view of the discharging action of the parallel feedback circuit, with a corresponding decrease in waveform generator output, at J2. When the output voltage of amplifier 30, i.e., at the plate of V9, has returned in a positive direction to switch the input of amplifier 40 to its load feedback circuit, at the time designated as $t=c$ in Fig. 2, the generator output signal at J2 reassumes the quiescent level. It should be noted that where the retrace time, i.e., the duration between the termination of the step wave and the time at which the waveform generator output level returns to the quiescent level, must be extremely short, provisions can be made for rapidly switching the input of amplifier 40 subsequent to termination of the step waveform voltage. This may, for example, be achieved by decreasing the magnitude of resistance R12 or by any circuit which rapidly discharges the integrator parallel feedback circuit subsequent to termination of the step waveform.

A satisfactorily operating circuit may comprise the part values listed below, but they are exemplary and should not be considered as limiting the scope of the invention:

| | |
|---|---|
| C1 | 0.1 mfd. |
| C2 | 0.1 mfd. |
| C3 | 180 mmfd. |
| C5 | 10 mmfd. |
| C7 | 1200 mmfd. |
| C8 | .22 mfd. |
| C9 | 1 mfd. |
| C10 | 2500 mmfd. |
| R1 | 91 ohms. |
| R2 | 150K ohms. |
| R3 | 8.2K ohms. |
| R4 | 30K ohms. |
| R5 | 150K ohms. |
| R6 | 220K ohms. |
| R7 | 30K ohms. |
| R8 | 1.8M ohms. |
| R9 | 330K ohms. |
| R10 | 180K ohms. |
| R11 | 150K ohms. |
| R12 | 90K ohms. |
| R13 | 250K ohms. |
| R14 | 200 ohms. |
| R15 | 5.1K ohms. |
| R16 | 100 ohms. |
| R17 | 62K ohms. |
| R18 | 100K ohms. |
| R19 | 250 ohms. |
| R20 | 15K ohms. |
| R21 | 1.8M ohms. |
| R22 | 100 ohms. |
| R23 | 1K ohm. |
| R24 | 9K ohms. |
| R25 | 1K ohm. |
| R26 | 500 ohms. |
| R27 | 100 ohms. |
| R28 | 250 ohms potentiometer. |
| R29 | 5K ohms. |
| R30 | 100 ohms. |
| R31 | 9K ohms. |
| R32 | 750 ohms. |
| R33 | 8K ohms. |
| R34 | 4K ohms potentiometer. |
| R35 | 100K ohms potentiometer |
| R36 | 170 ohms. |
| R37 | 620K ohms. |
| V1 | ½ of type 5751. |
| V2 | ½ of type 5814. |
| V3 | ½ of type 5814. |
| V4 | ½ of type 5751. |
| V5 | ½ of type 5726. |
| V6 | ½ of type 5726. |
| V7 | ½ of type 6072. |
| V8 | ½ of type 6072. |
| V9 | type 5654. |
| V10 | ½ of type 5726. |
| V11 | ½ of type 5726. |
| V12 | ½ of type 6072. |
| V13 | ½ of type 6072. |
| V14 | ½ of type 6072. |
| V15 | ½ of type 6072. |
| V16 | ½ of type 6072. |
| V17 | ½ of type 6072. |
| V18 | ½ of type 5687. |
| V19 | ½ of type 5687. |
| +E1 | +150 volts. |
| +E2 | +300 volts. |
| −E1 | −150 volts. |
| −E2 | −300 volts. |

It may be desirable to vary the parameters of the above listed parts, and it may indeed be desirable to employ other forms of component assemblies, i.e., input waveform generators, amplifiers, and switching control circuits.

In summary, the present invention provides for the production of electrical waveforms which are very accurately displaced in a voltage-time coordinate. The waveform accuracy is improved by decreasing the random variation of the waveform voltage amplitude at the time of waveform initiation. By thus stabilizing the amplitude, operational amplifier type of waveform generators having extremely high gain amplifiers, may be employed since the waveform output will not be greatly affected by random voltage variations caused by noise in the amplifier input. As has been described, the reduction in random amplitude variation at the time of waveform initiation, is achieved at the expense of some certainty in waveform initiating time in that the output waveform is not initiated until a short time after the application of the waveform initiating voltage to the input of the waveform generating circuit. The invention thus rests on the premise that the overall waveform certainty, i.e., the accuracy of waveform voltage at any given time during waveform duration may be markedly increased by reducing the uncertainty of initial waveform amplitude, i.e., reducing initial amplitude random variation, at the expense of a slight uncertainty in waveform initiation time. This may be demonstrated with the aid of Fig. 4 which illustrates a hypothetical series of linear waveforms in a voltage-time coordinate system. Waveform *a* represents an ideal linearly rising waveform initiated at a time $T=0$ and having an initial voltage amplitude designated as A. Waveform *b*, representing a linear waveform actually produced by a conventional generator, is also initiated at a time $T=0$, but has an initial voltage amplitude displaced from A by a voltage increment *c*, which represents the random variation, or uncertainty, of the initial waveform voltage. It may be seen that after a random time duration, designated in Fig. 4 as $T=X$, the instantaneous amplitude of waveform *b* appreciably varies from that of ideal waveform *a* by a voltage increment, designated as *d*. By utilizing the described invention it is possible to reduce the maximum random variation of the initiating voltage to a voltage increment *e*. This, however, entails introducing a small uncertainty of waveform starting time. Assuming a maximum time delay period ending at the time designated at *t*, in the starting time of the waveform, the waveform representing the maximum overall uncertainty, i.e., maximum amplitude variation at any time during waveform generation, will be one represented by line *f*. This waveform is initiated at the time *t* and has a maximum random variation in initial amplitude, *e*. It may be seen from Fig. 4, that at time $T=X$, the instantaneous amplitude of waveform *f* varies from the ideal only by the increment designated as *g*, a much smaller voltage variation than is represented by *d*, the variation of the conventionally generated waveform *b*. The invention thus permits a marked decrease in voltage deviation error of a generated waveform.

Obviously many modifications and variations of the present invention are possible in the light of the above teachings. Thus other forms of linear or nonlinear waveform generators may be employed. It is, therefore, to be understood that within the scope of the appended claims the invention may be practiced otherwise than as specifically described.

What I claim as new and desire to secure by Letters Patent of the United States is:

1. A parallel feedback type of waveform generator comprising a first and second amplifier, impedance means connected from the output of said second amplifier to the input of said first amplifier, the input of said first amplifier adapted to be connected to a waveform input, the output of said second amplifier, upon application of said waveform input, supplying a waveform output having predetermined amplitude-time characteristics, means to stabilize the starting voltage of said waveform output comprising a first switching means connected between the output of said first amplifier and the input of said second amplifier, said second amplifier having an output load circuit, second switching means connected in a degenerative load feedback circuit from a point on said output load circuit to the input of said second amplifier, control means responsive to said waveform input interposed between said input and said switching means so as to control said first and second switching means as a function of said waveform input, said control means actuating said first switching means during a first time period to connect said second amplifier input to said first amplifier output subsequent to application of said waveform input for at least the time of the waveform output; said control means actuating said second switching means during a second time period to complete said load feedback circuit of said second amplifier.

2. A parallel feedback type of integrating circuit comprising a first and second amplifier, capacitive impedance means connected from the output of said second amplifier to the input of said first amplifier, the input of said first amplifier adapted to be connected to a step waveform, the output of said second amplifier supplying a linear waveform output upon application of said step waveform, means to stabilize the starting voltage of said linear waveform output comprising a first switching means connected between the output of said first amplifier and the input of said second amplifier, said second amplifier having an output load circuit, second switching means connected in a degenerative load feedback circuit from a point on said output load circuit to the input of said second amplifier, control means responsive to said step waveform input and an output controlling said first and second switching means as a function of said step waveform, said control means actuating said first switching means during a first time period to connect said second amplifier input to said first amplifier output subsequent to application of said step waveform for at least the time of said output waveform, said control means actuating said second switching means during a second time period to complete said load feedback circuit of said second amplifier.

3. A parallel feedback type of integrating circuit comprising a first and a second amplifier, capacitive impedance means connected from the output of said second amplifier to the input of said first amplifier, the input of said first amplifier adapted to be connected to a step voltage input, the second amplifier output supplying a linear waveform output upon application of said step voltage input, means to stabilize the starting voltage of said linear waveform output comprising a first switching means, energization of said first switching means during a first period connecting the first amplifier output to the second amplifier input, said second amplifier having an output load circuit, a second switching means, energization of said second switching means during a second period connecting a point on said output load circuit for degenerative feedback to the input of said second amplifier, control means having an input connected to said first amplifier output and having an output controlling said first and second switching means, said control means actuating said first switching means for said first period upon a first variation of said first amplifier output to a predetermined potential, said control means actuating said second switching means for said second period upon a second variation of said first amplifier output to substantially said predetermined potential.

4. A waveform generator wherein an input waveform having first amplitude-time characteristics is transformed into an output waveform having predetermined second amplitude-time characteristics comprising a high gain amplifier having cascaded first and second amplifying sections, waveform modifying means comprising an integrating capacitor coupled in a feedback path between the input and output of said amplifier, means for decreasing the amplitude deviation of said output waveform from said predetermined second characteristics comprising switching means for disconnecting said first amplifying section from the second amplifying section and for connecting the input of the second amplifying section to the output thereof by a degenerative feedback connection for stabilizing the output, and amplitude responsive means coupled to the output of said first amplifying section for actuating said switching means in response to said input waveform whereby the period during which said sections are disconnected and said last recited degenerative feedback connection is made extends until shortly after the application of said input waveform and thereby increases the accuracy of the output waveform by stabilizing the starting amplitude.

References Cited in the file of this patent

UNITED STATES PATENTS

| | | |
|---|---|---|
| 2,607,528 | McWhirter et al. | Aug. 19, 1952 |
| 2,672,529 | Villard | Mar. 16, 1954 |
| 2,683,806 | Moody | July 23, 1954 |
| 2,757,283 | Ingerson et al. | July 31, 1956 |
| 2,789,218 | Leonard | Apr. 16, 1957 |
| 2,843,736 | Huntley | July 15, 1958 |